United States Patent
Cader et al.

(10) Patent No.: US 10,582,640 B2
(45) Date of Patent: Mar. 3, 2020

(54) CONDUCTING PLASTIC COLD PLATES

(71) Applicant: Hewlett Packard Enterprise Development LP, Houston, TX (US)

(72) Inventors: Tahir Cader, Liberty Lake, WA (US); Harvey Lunsman, Chippewa Falls, WI (US); Ernesto Ferrer Medina, Aguadilla, PR (US); John Franz, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/974,798

(22) Filed: May 9, 2018

(65) Prior Publication Data
US 2019/0350107 A1    Nov. 14, 2019

(51) Int. Cl.
| G06F 1/16 | (2006.01) |
| H05K 5/00 | (2006.01) |
| H05K 7/00 | (2006.01) |
| H05K 7/20 | (2006.01) |
| G06F 1/20 | (2006.01) |

(52) U.S. Cl.
CPC ........... H05K 7/20254 (2013.01); G06F 1/20 (2013.01); H05K 7/20281 (2013.01); H05K 7/20509 (2013.01)

(58) Field of Classification Search
CPC ............ G06F 1/20; G06F 1/203; G06F 1/206; H05K 7/20254; H05K 7/20281; H05K 7/20509; H05K 7/20218; H05K 7/2039; H05K 7/2029; H05K 7/20381; H05K 7/20336

USPC ........... 361/702, 701, 689, 703, 711, 679.52
See application file for complete search history.

(56) References Cited

U.S. PATENT DOCUMENTS

| 5,453,911 | A  * | 9/1995 | Wolgemuth | ....... H05K 7/20927 165/80.4 |
| 6,230,791 | B1 * | 5/2001 | Van Dine | ............. H01L 23/473 165/168 |
| 7,551,440 | B2 | 6/2009 | Belady et al. | |
| 8,947,873 | B2 * | 2/2015 | Campbell | .......... H05K 7/20236 361/679.52 |
| 9,516,791 | B2 | 12/2016 | Chester et al. | |
| 9,680,385 | B2 * | 6/2017 | Pietrantonio | ..... H02M 3/33546 |
| 2008/0296256 | A1 | 12/2008 | Panek | |
| 2014/0146467 | A1 * | 5/2014 | Campbell | .......... H05K 7/20236 361/679.53 |
| 2016/0126849 | A1 * | 5/2016 | Pietrantonio | ..... H02M 3/33546 363/21.04 |
| 2017/0208708 | A1 | 7/2017 | Davidson | |

OTHER PUBLICATIONS

Sherman, L. M.; "Plastics That Conduct Heat"; Jun. 1, 2001; 7 pages.

* cited by examiner

Primary Examiner — Anthony M Haughton
(74) Attorney, Agent, or Firm — Brooks, Cameron & Huebsch, PLLC

(57) ABSTRACT

Cold plates are described herein. In one example, a cold plate can include a heat plate bay coupled to a first side and a second side of a coolant channel, a heat plate removably coupled within the heat plate bay, and a gasket coupled to the heat plate to seal the heat plate within the heat plate bay to provide a fluid path between the first side and the second side of the coolant channel.

18 Claims, 5 Drawing Sheets

CONDUCTING PLASTIC COLD PLATES

BACKGROUND

Computing devices can utilize liquid cooling systems that can circulate a liquid, such as water, throughout the computing device to cool heat generating components such as processors, memory resources, and/or other electrical components. Different components of the computing device can generate different quantities of heat. In some examples, components that provide a relatively higher performance can also generate a relatively greater quantity of heat. In some examples, computing devices can utilize relatively higher performing components within the same or similar footprint, which can generate a greater quantity of heat within the same or similar footprint.

DETAILED DESCRIPTION

Figure 1:
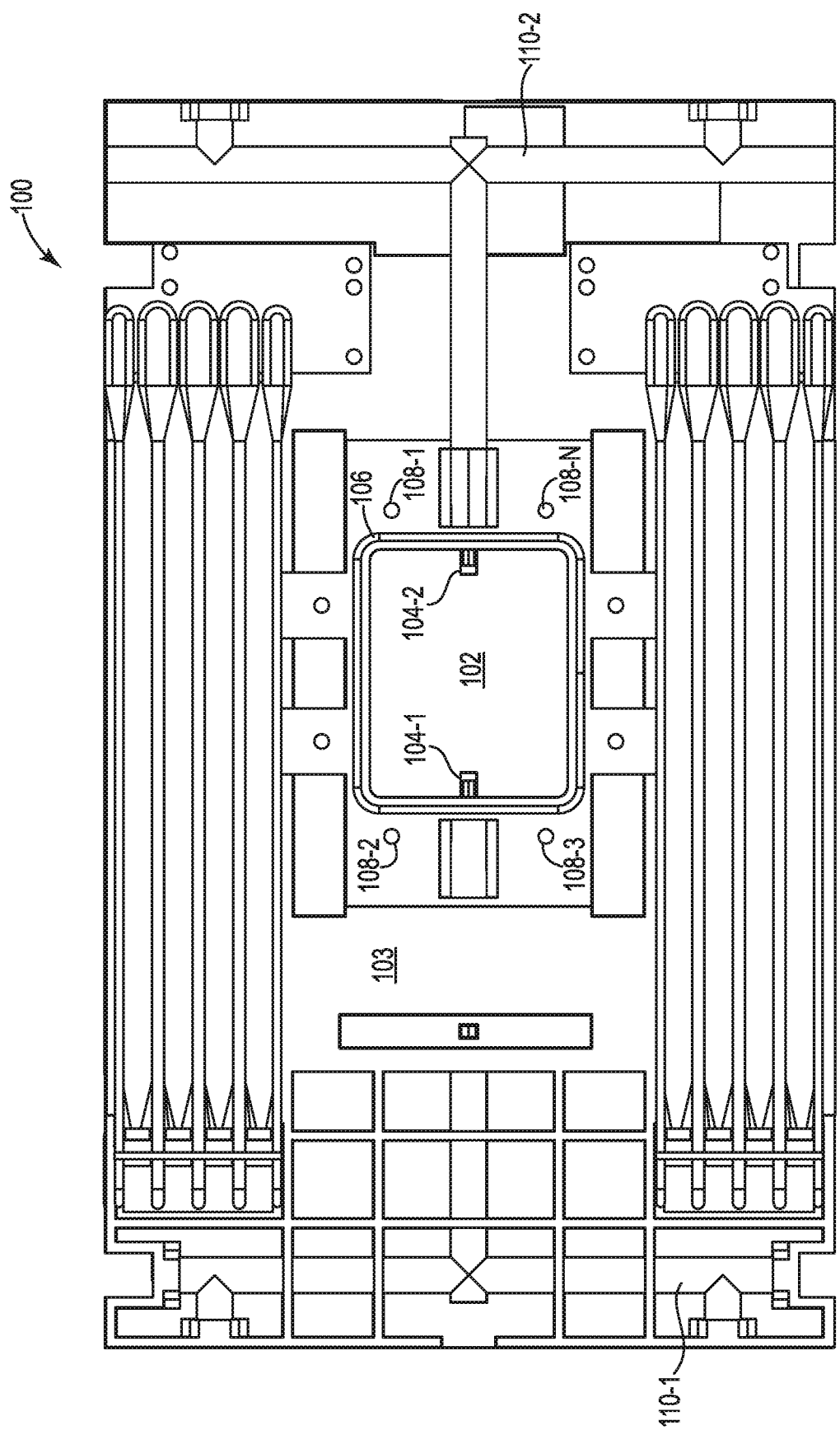
FIG. 1 illustrates an example system for a conductive plastic cold plate consistent with the present disclosure.

A cold plate can be a device that can be utilized to remove heat from a computing device or component of a computing device. For example, a cold plate can be a device that can be made of a conductive material that can transfer heat away from components of the computing device. In some examples, the cold plate can utilize liquid cooling resources such as water or coolant to transfer heat away from components of the computing device. For example, the cold plate can include a coolant channel that can transfer a liquid such as water or coolant across the components to remove heat from a surface of the components. In this example, the heat of the components can be transferred to the water or coolant and the coolant channel can move the water or coolant away from the components to a heat exchanger.

In some examples, the cold plate can be coupled to a printed circuit board (PCB) or printed circuit assembly (PCA) of the computing device. As used herein, a PCB or PCA can include a device that can mechanically support and/or electrically connect the components of a computing device. In some examples, a PCB or PCA can utilize a plurality of conductive tracks, pads, and/or other features etched from one or more sheet layers of a conductive substrate like copper laminated onto and/or between sheet layers of a non-conductive substrate. In some examples, the cold plate can be coupled to a main PCB or motherboard of the computing device.

In some examples, the cold plate can be positioned over a PCB of the computing device. In some examples, the coolant channels of the cold plate can be routed over a plurality of different components of the computing device. For example, a coolant channel of the cold plate can be routed over a central processing unit (CPU) of the computing device. In some examples, a heat generating component such as a CPU can be of different sizes for different models. For example, a first CPU from a first manufacturer can have a first height and a second CPU from a second manufacturer can have a second height that is different than the first height. When the cold plate includes a heat plate, the heat plate can be positioned on or relatively close to a surface of the heat generating component. Systems and devices herein can be utilized to position a heat plate over a heat generating component and/or adjust the height of the heat plate based on a height of the particular heat generating component.

A number of systems and devices for cold plates are described herein. In some examples, a cold plate can include a thermally conductive plastic forming a coolant channel that includes a heat plate formed into the thermally conductive plastic and an exterior surface of the thermally conductive plastic with a bonding location to couple a heat pipe to the exterior surface of the thermally conductive plastic. In some examples, the heat pipe may not be able to be embedded within the thermally conductive plastic without damaging the heat pipe. For example, the heat pipe can be a flat heat pipe that may not be able to withstand a pressure during injection molding of the thermally conductive plastic.

In some examples, the cold plates described herein can include a heat plate bay coupled to a first side and a second side of a coolant channel, a heat plate removably coupled within the heat plate bay, and a gasket coupled to the heat plate to seal the heat plate within the heat plate bay to provide a fluid path between the first side and the second side of the coolant channel. The cold plates described herein can be utilized to mount or couple the heat plate within the heat plate bay such that a surface of the heat plate is adjustable based on a height of a gasket used to liquid seal the heat plate within the heat plate bay. In this way the same cold plate can be utilized for a plurality of different component types utilized by the computing device. Even though a single heat plate bay and heat plate are described, additional heat plate bays and corresponding heat plates can be utilized with the cold plates described herein.

The figures herein follow a numbering convention in which the first digit corresponds to the drawing figure number and the remaining digits identify an element or component in the drawing. Elements shown in the various figures herein may be capable of being added, exchanged, and/or eliminated so as to provide a number of additional examples of the present disclosure. In addition, the proportion and the relative scale of the elements provided in the figures are intended to illustrate the examples of the present disclosure and should not be taken in a limiting sense.

FIG. 1 illustrates an example system 100 for a conductive plastic cold plate 103 consistent with the present disclosure. In some examples, the thermally conductive plastic cold plate 103 can be positioned over a motherboard of a computing device that includes a plurality of different computing components. In some examples, the system 100 can include a heat plate bay 102. The heat plate bay 102 can be positioned at a location that is over an area of a heat generating component of a computing device. As used herein, a heat generating component of a computing device can be a component that can generate heat during operation. For example, the heat generating component can include, but is not limited to: a processor, a memory resource, graphics processor, hard disk drive (HDD), and/or an optical disk drive (ODD).

In some examples, the heat plate bay 102 can include an aperture to receive a heat plate. For example, the heat plate bay 102 aperture can include an opening on a first side of the heat plate bay 102 that can receive a portion of the heat plate. For example, the heat plate can include a first portion that includes a plurality of fins that can be positioned within the heat plate bay 102 and a second portion that can be positioned on the exterior sides of the heat plate bay 102. As used herein, a heat plate can include a thermally conductive material to transfer heat from a first location to a second location. For example, the heat plate can remove heat from a heat generating component and transfer the heat into the heat plate bay 102. In some examples, the heat plate can be made of a metallic material such as copper or aluminum. The heat plate will be described further in reference to FIG. 2.

In some examples, the heat plate bay 102 can be formed into a thermally conductive plastic material of the cold plate 103. For example, the cold plate 103 can be molded utilizing a molding process. As used herein, a molding process can be a method for forming a polymer or plastic device. For example, the molding process can include an injection molding process where a liquid polymer material is injected into a mold and allowed to form the cold plate 103.

As described herein, the cold plate 103 can be made of a thermally conductive plastic material. As used herein a thermally conductive plastic material can include a polymer material that is a thermally conductive material with a relatively high thermal conductivity. In some examples, a thermally conductive material can include a material that can transfer heat from a first location to a second location. In some examples, the heat plate that can be positioned within the heat plate bay 102 can be made of a material that has a relatively high thermal conductivity. As used herein, thermal conductivity is a property of a material to conduct heat. Heat transfer occurs at a lower rate in materials that have a relatively low thermal conductivity and heat transfer occurs at a higher rate in materials that have a relatively high thermal conductivity.

In some examples, heat plate bay 102 can be coupled to a coolant channel 104-1, 104-2. For example, a first side of the heat plate bay 102 can be coupled to a first side of the coolant channel 104-1 and a second side of the heat plate bay 102 can be coupled to a second side of a coolant channel 104-2. In some examples, the heat plate bay 102 can be coupled to the first side of the coolant channel 104-1 by an aperture within the material of the cold plate 103 that can allow a liquid or coolant to move through the aperture into or out of the heat plate bay 102. In another example, the heat plate bay 102 can be coupled to the second side of the coolant channel 104-2 by an aperture within the material of the cold plate 103 that can allow a liquid or coolant to move through the aperture into or out of the heat plate bay 102.

In some examples, the first side of the coolant channel 104-1 can be a coolant input channel that can be coupled to a first coolant manifold 110-1 and the second side of the coolant channel 104-2 can be a coolant output channel and can be coupled to a second coolant manifold 110-2. In some examples, the first coolant manifold 110-1 can be an input manifold or coolant supply manifold that can deliver liquid or coolant from a heat exchanger. As used herein, a heat exchanger can be a device that can lower a temperature of a liquid or transfer heat from a liquid to a gas and/or from a liquid to a liquid. For example, the heat exchanger can include a coil that can receive the liquid and air can be passed through the coil to remove heat from the liquid within the coil. In this example, the coil of the heat exchanger can be utilized to transfer heat from the liquid to the air that is passing through the coil.

In some examples, the first side of the coolant channel 104-1 can be a coolant input that can be coupled to a plurality coolant input channels. That is, the first side of the coolant channel 104-1 are illustrated as a single channel, but the first side of the coolant channel 104-1 can include a plurality of channels that can each have a corresponding aperture that leads into a corresponding portion of the heat plate bay 102. In some examples, the heat plate bay 102 can include a plurality of baffles that can separate the heat plate bay 102 into a plurality of channels and/or a plurality of portions that can each receive liquid from a corresponding aperture of a channel from the plurality of channels. In a similar way, the second side of the coolant channel 104 can include a plurality of channels that can correspond to the plurality of portions separated by the baffles within the heat plate bay 102.

In some examples, the second coolant manifold 110-2 can be an output manifold or a coolant return manifold that can receive liquid or coolant from the heat plate bay 102 and deliver the liquid or coolant to the heat exchanger. In some examples, the liquid or coolant can be circulated through the heat exchanger, into the first coolant manifold 110-1, into the heat plate bay 102 through the first side of the coolant channel 104-1, out of the heat plate bay 102 through the second side of the coolant channel 104-2, and back to the heat exchanger with a liquid pump.

In some examples, the system 100 can include a gasket 106. As used herein, a gasket 106 can include a material utilized to seal a junction between two surfaces. For example, the gasket 106 can provide a liquid seal between the cold plate 103 and a heat plate positioned within the heat plate bay 102. In some examples, the gasket 106 can be made of a polymer or rubber material that can compress when the heat plate is coupled to the heat plate bay 102 to form a liquid seal between the heat plate and the heat plate bay 102. As used herein, a liquid seal can include a seal that can prevent the liquid or coolant from escaping beyond the gasket 106. For example, the gasket 106 can provide a liquid seal between the heat plate and the heat plate bay 102 such that liquid cannot escape the heat plate bay 102 when the heat plate is coupled to the heat plate bay 102.

In some examples, the gasket 106 can surround the aperture of the heat plate bay 102. In some examples, the gasket 106 can be positioned within a recessed portion that surrounds the aperture of the heat plate bay 102. In some examples, the recessed portion can be molded into the cold plate 103 to receive the gasket 106. In some examples, the recessed portion can be utilized to provide a better liquid seal between the heat plate and the heat plate bay 102. For example, the recessed portion can be a similar shape and/or size of the gasket 106 to align the gasket 106 with a corresponding recessed portion of the heat plate. In this example, the recessed portion of the cold plate 103 can prevent the gasket from moving when coupling the heat plate to the heat plate bay 102. In some examples, the gasket 106 can provide a liquid seal between the thermally conductive plastic of the heat plate bay 102 with the metallic material of the heat plate.

In some examples, the gasket 106 can be a particular height or thickness. In some examples, the height of the gasket can alter a position of a heat plate coupled within the heat plate bay 102. For example, a first gasket with a first height can provide the heat plate in a first position and a second gasket with a second height can provide the heat plate in a second position. In some examples, the position of the heat plate can be a height between the cold plate 103 and a surface of an exposed side of the heat plate. In some examples, the position or height of the heat plate can be based on a position or height of a heat generating component of the computing device. For example, a first processor can have a first height and a second processor can have a second height that is different than the first height.

In some examples, a heat generating component that is relatively shorter can correspond to a gasket 106 that is relatively larger or a gasket with a relatively larger height to position the heat plate closer to the heat generating component. In other examples, a heat generating component that is relatively taller can correspond to a gasket 106 that is relatively smaller or shorter in height to accommodate the relatively taller heat generating component. Since different types of heat generating components can have different heights, the gasket 106 can be utilized to alter a height of the heat plate to accommodate a plurality of different heat generating components.

In some examples, the heat plate can be coupled to the heat plate bay 102 utilizing a plurality of apertures 108-1, 108-2, 108-3, 108-N. In some examples, the plurality of apertures 108-1, 108-2, 108-3, 108-N can be holes or apertures designated to receive a locking mechanism. For example, the plurality of apertures 108-1, 108-2, 108-3, 108-N can be screw holes designated to receive a screw or bolt. In this example, the plurality of apertures 108-1, 108-2, 108-3, 108-N can include threads that can be utilized to receive a screw or bolt.

In some examples, plurality of apertures 108-1, 108-2, 108-3, 108-N can correspond to a plurality of apertures of a heat plate. In some examples, the plurality of apertures 108-1, 108-2, 108-3, 108-N can be aligned to receive a locking mechanism, such as a screw or bolt, through the plurality of apertures of the heat plate. For example, a screw or bolt can be positioned through the plurality of apertures of the heat plate and into the plurality of apertures 108-1, 108-2, 108-3, 108-N to couple the heat plate into the heat plate bay 102.

In some examples, the system 100 can be cooling device or cooling system for a computing device. For example, the system 100 can be a cooling device or cooling system for a server. In some examples, the system 100 can be utilized with a plurality of different computing devices with a plurality of different computing components. For example, the system 100 can be utilized with processors that have different heights by altering the gasket 106 to adjust the height of the heat plate coupled within the heat plate bay 102. In this way, the same cold plate 103 and heat plate can be utilized for a plurality of different computing devices without having to alter the structure of the cold plate 103 or heat plate.

Figure 2:
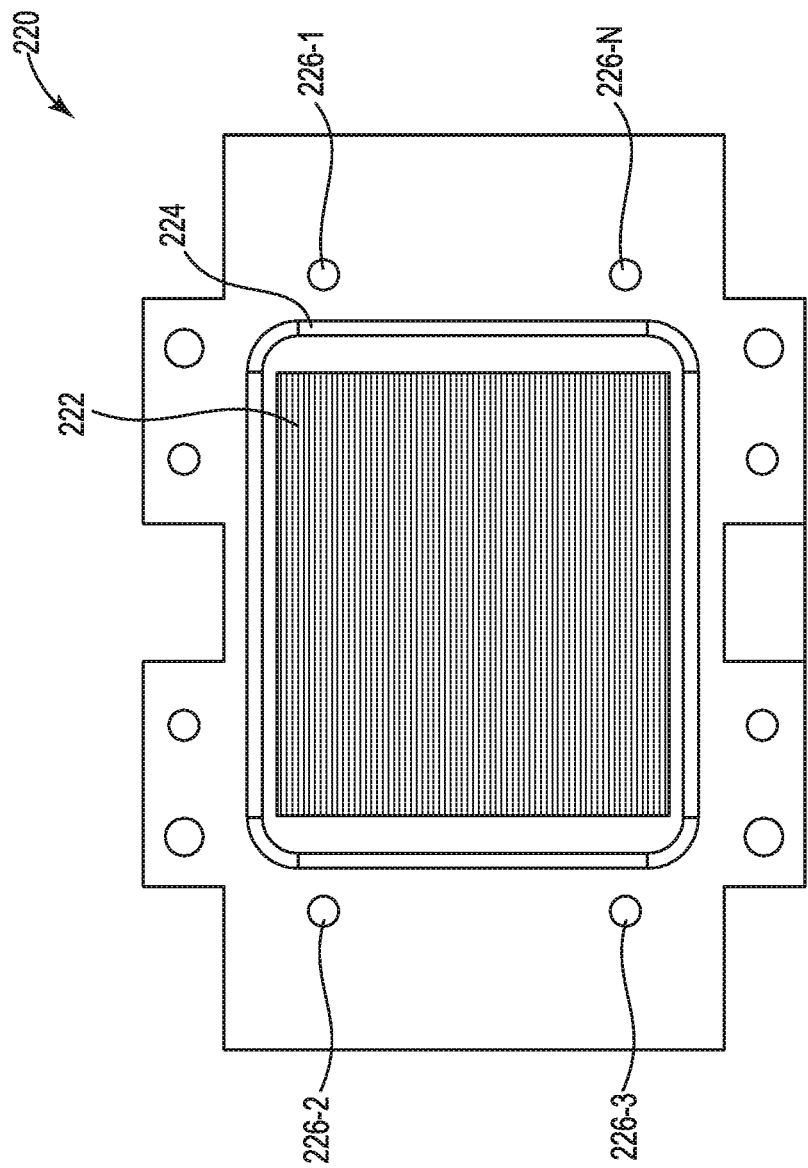
FIG. 2 illustrates an example heat plate for a conductive plastic cold plate consistent with the present disclosure.

FIG. 2 illustrates an example heat plate 220 for a conductive plastic cold plate consistent with the present disclosure. In some examples, the heat plate 220 can be utilized with the system 100 as referenced in FIG. 1. For example, the heat plate 220 can be coupled to the heat plate bay 102 as referenced in FIG. 1. In some examples, the heat plate 220 can be made of a thermally conductive material such as aluminum, copper, or gold.

Figure 3:
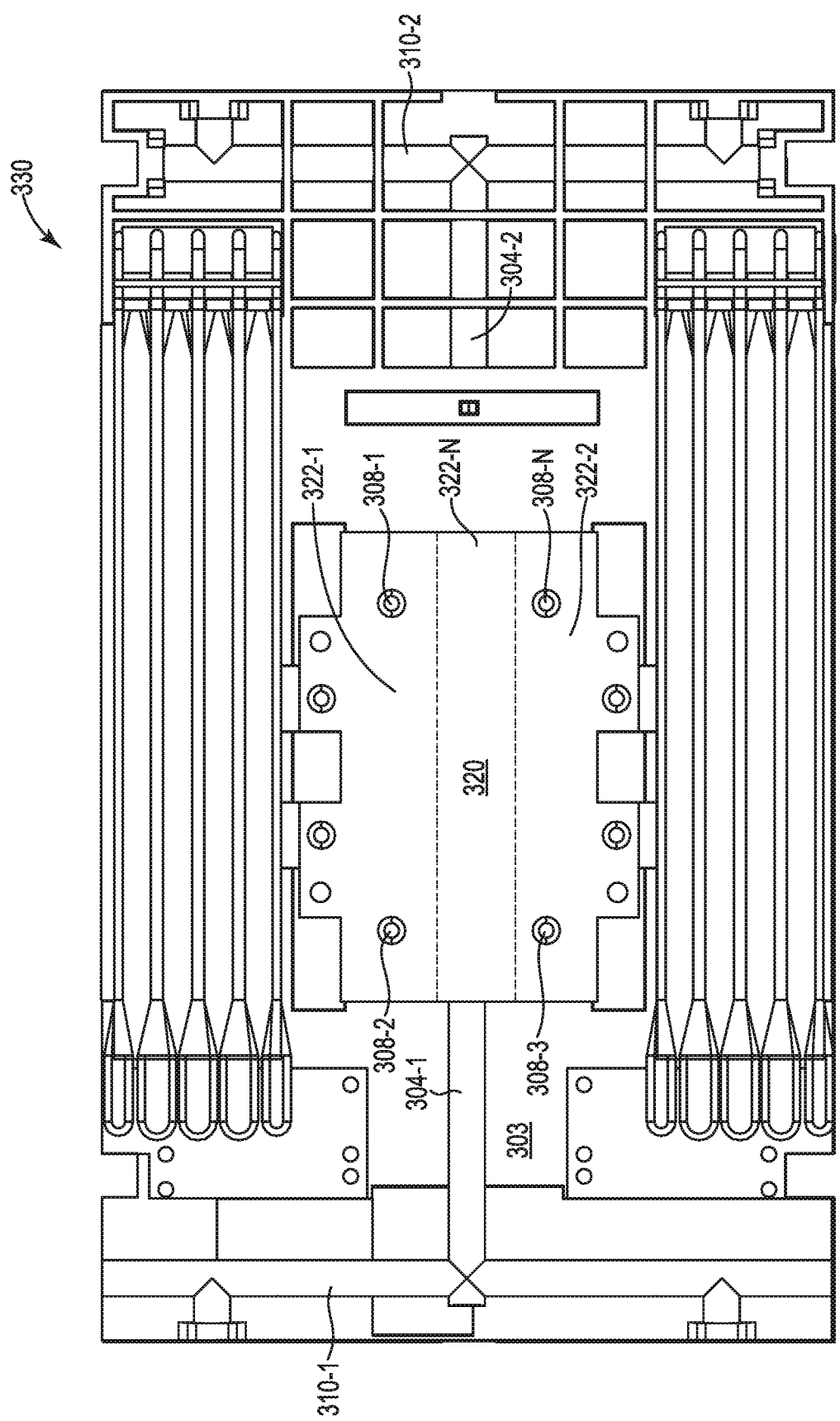
FIG. 3 illustrates an example system for a conductive plastic cold plate with heat plate consistent with the present disclosure.

FIG. 2 illustrates the heat plate 220 from a first side that can be positioned within the heat plate bay of a cold plate. In some examples, the heat plate 220 can include a second side that is illustrated in FIG. 3 to be positioned over or on a computing component. For example, the second side of the heat plate 220 can be a flat surface that can be in physical contact with a surface of a computing component such as a processor. In this example, heat generated by the computing component can be transferred through the second side of the heat plate 220 into a plurality of fins 222 that are positioned within the heat plate bay of the cold plate. In this example, the liquid flowing through the heat plate bay can remove the heat from the fins 222.

In some examples, the plurality of fins 222 can be coupled to a surface of the heat plate 220. For example, the plurality of fins 222 can be soldered or attached to a surface of the heat plate 220. In some examples, the heat plate 220 can include a plurality of fins 222 that are formed from the heat plate 220. For example, the heat plate 220 and the plurality of fins 222 can be formed of the same material or molded as a single piece of conductive material. In some examples, the heat plate 220 can include a vapor chamber to increase the heat transfer between a heat generating component and the plurality of fins 222.

In some examples, the plurality of fins 222 can extend from the surface of the heat plate 220 into a coolant channel that is generated by sealing the heat plate 220 into the heat plate bay of a cold plate. In some examples, the plurality of fins 222 can be positioned within the coolant channel to transfer heat from the heat plate 220 into the liquid within the coolant channel. In some examples, the plurality of fins 222 can be ribs or tubular heat pipes to transfer the heat from the heat plate 220 into the liquid within the coolant channel.

In some examples, the heat plate 220 can include a recessed portion 224. In some examples, the recessed portion 224 can be utilized to receive a gasket, such as gasket 106 as referenced in FIG. 1. In some examples, the recessed portion 224 can divide the heat plate 220 into a first portion inside the recessed portion 224 and a second portion outside the recessed portion 224. In some examples, the first portion of the heat plate 220 can be positioned within the coolant channel of the heat plate bay and the second portion can be positioned outside the coolant channel of the heat plate bay.

In some examples, the recessed portion 224 can be molded into or machined out of the heat plate 220 to receive the gasket. As used herein, machined out can include a process where a mechanical device removes material from the heat plate 220. In some examples, the recessed portion 224 can be utilized to provide a better liquid seal between the heat plate 220 and the heat plate bay. For example, the recessed portion 224 can be a similar shape and/or size of the gasket to align the gasket with a corresponding recessed portion of the cold plate or heat plate bay. In this example, the recessed portion 224 of the heat plate 220 can prevent the gasket from moving when coupling the heat plate 220 to the heat plate bay.

As described herein, the gasket can be a particular height or thickness. In some examples, the height of the gasket can alter a position of a heat plate 220 coupled within the heat plate bay. For example, a first gasket with a first height can provide the heat plate 220 in a first position and a second gasket with a second height can provide the heat plate 220 in a second position. In some examples, the position or height of the heat plate 220 can be based on a position or height of a heat generating component of the computing device. For example, a first processor can have a first height and a second processor can have a second height that is different than the first height.

In some examples, a heat generating component that is relatively shorter can correspond to a gasket that is relatively larger or a gasket with a relatively larger height to position the heat plate 220 closer to the heat generating component. In other examples, a heat generating component that is relatively taller can correspond to a gasket that is relatively smaller or shorter in height to accommodate the relatively taller heat generating component. Since different types of heat generating components can have different heights, the gasket can be utilized to alter a height of the heat plate 220 to accommodate a plurality of different heat generating components.

In some examples, the heat plate 220 can be coupled to the heat plate bay utilizing a plurality of apertures 226-1, 226-2, 226-3, 226-N. In some examples, the plurality of apertures 226-1, 226-2, 226-3, 226-N can be holes or apertures designated to receive a locking mechanism. For example, the plurality of apertures 226-1, 226-2, 226-3, 226-N can be screw holes designated to receive a screw or bolt. In some examples, the plurality of apertures 226-1, 226-2, 226-3, 226-N can include threads that can be utilized to receive a screw or bolt.

In some examples, plurality of apertures 226-1, 226-2, 226-3, 226-N can correspond to a plurality of apertures of a cold plate (e.g., plurality of apertures 108-1, 108-2, 108-3, 108-N as referenced in FIG. 1, etc.). In some examples, the plurality of apertures 226-1, 226-2, 226-3, 226-N can be aligned to receive a locking mechanism, such as a screw or bolt, into the plurality of apertures of the cold plate. For example, a screw or bolt can be positioned through the plurality of apertures 226-1, 226-2, 226-3, 226-N of the heat plate 220 into the plurality of corresponding apertures of the cold plate to couple the heat plate 220 into the heat plate bay 102 of the cold plate.

In some examples, the heat plate 220 can be utilized with the same cold plate for a plurality of different types of heat generating components of a computing device. For example, the heat plate 220 can be utilized with components that have different heights by utilizing a particular gasket with a particular height to position the second side or flat side of the heat plate 220 on or above the component. In this example, the particular gasket can be selected based on a height of the computing component.

FIG. 3 illustrates an example system 330 for a conductive plastic cold plate 303 with heat plate consistent with the present disclosure. In some examples, the system 330 can illustrate when a heat plate 320 is coupled to the cold plate 303. As described herein, the heat plate 320 can be coupled to the cold plate 303 to seal the heat plate bay to complete a coolant channel between the first side of the coolant channel 304-1 and the second side of the coolant channel 304-2.

In some examples, the system 330 can include a heat plate bay to receive a heat plate 320. The heat plate 320 can be positioned at a location that is over an area of a heat generating component of a computing device. As used herein, a heat generating component of a computing device can be a component that can generate heat during operation. For example, the heat generating component can include, but is not limited to: a processor, a memory resource, graphics processor, hard disk drive (HDD), and/or an optical disk drive (ODD).

In some examples, the heat plate bay can include an aperture to receive the heat plate 320. For example, the heat plate bay aperture can include an opening on a first side of the heat plate bay that can receive a portion of the heat plate 320. For example, the heat plate 320 can include a first portion that includes a plurality of fins that can be positioned within the heat plate bay and a second portion that can be positioned on the exterior sides of the heat plate bay. As used herein, a heat plate 320 can include a thermally conductive material to transfer heat from a first location to a second location. For example, the heat plate 320 can remove heat from a heat generating component and transfer the heat into the heat plate bay of the cold plate 303.

As described herein, the cold plate 303 can be made of a thermally conductive plastic material. As used herein a thermally conductive plastic material can include a polymer material that is a thermally conductive material with a relatively high thermal conductivity. In some examples, a thermally conductive material can include a material that can transfer heat from a first location to a second location. In some examples, the heat plate that can be positioned within the heat plate bay can be made of a material that has a relatively high thermal conductivity. As used herein, thermal conductivity is a property of a material to conduct heat. Heat transfer occurs at a lower rate in materials that have a relatively low thermal conductivity and heat transfer occurs at a higher rate in materials that have a relatively high thermal conductivity.

In some examples, the heat plate bay can be coupled to a coolant channel 304-1, 304-2. For example, a first side of the heat plate bay can be coupled to a first side of the coolant channel 304-1 and a second side of the heat plate bay can be coupled to a second side of a coolant channel 304-2. In some examples, the heat plate bay can be coupled to the first side of the coolant channel 304-1 by an aperture within the material of the cold plate 303 that can allow a liquid or coolant to move through the aperture into or out of the heat plate bay. In another example, the heat plate bay can be coupled to the second side of the coolant channel 304-2 by an aperture within the material of the cold plate 303 that can allow a liquid or coolant to move through the aperture into or out of the heat plate bay.

In some examples, the first side of the coolant channel 304-1 can be a coolant input channel that can be coupled to a first coolant manifold 310-1 and the second side of the coolant channel 304-2 can be a coolant output channel and can be coupled to a second coolant manifold 310-2. In some examples, the first coolant manifold 310-1 can be an input manifold or coolant supply manifold that can deliver liquid or coolant from a heat exchanger. As used herein, a heat exchanger can be a device that can lower a temperature of a liquid or transfer heat from a liquid to a gas and/or from a first liquid to a second liquid. For example, the heat exchanger can include a coil that can receive the liquid and air can be passed through the coil to remove heat from the liquid within the coil. In this example, the coil of the heat exchanger can be utilized to transfer heat from the liquid to the air that is passing through the coil.

In some examples, the second coolant manifold 310-2 can be an output manifold or a coolant return manifold that can receive liquid or coolant from the heat plate bay and deliver the liquid or coolant to the heat exchanger. In some examples, the liquid or coolant can be circulated through the heat exchanger, into the first coolant manifold 310-1, into the heat plate bay through the first side of the coolant channel 304-1, out of the heat plate bay through the second side of the coolant channel 304-2, and back to the heat exchanger with a liquid pump.

In some examples, the system 330 can include a gasket that is positioned between the heat plate 320 and the heat plate bay. As used herein, a gasket can include a material utilized to seal a junction between two surfaces. For example, the gasket can provide a liquid seal between the cold plate 303 and a heat plate 320 positioned within the heat plate bay. In some examples, the gasket can be made of a polymer or rubber material that can compress when the heat plate 320 is coupled to the heat plate bay to form a liquid seal between the heat plate 320 and the heat plate bay. As used herein, a liquid seal can include a seal that can prevent the liquid or coolant from escaping beyond the gasket. For example, the gasket can provide a liquid seal between the heat plate 320 and the heat plate bay such that liquid cannot escape the heat plate bay when the heat plate 320 is coupled to the heat plate bay.

In some examples, the gasket can be a particular height or thickness. In some examples, the height of the gasket can alter a position of a heat plate 320 coupled within the heat plate bay. For example, a first gasket with a first height can provide the heat plate 320 in a first position and a second gasket with a second height can provide the heat plate 320 in a second position. In some examples, the position of the heat plate 320 can be a height between the cold plate 103 and a surface of an exposed side of the heat plate 320. In some examples, the position or height of the heat plate 320 can be based on a position or height of a heat generating component of the computing device. For example, a first processor can have a first height and a second processor can have a second height that is different than the first height.

In some examples, a heat generating component that is relatively shorter can correspond to a gasket that is relatively larger or a gasket with a relatively larger height to position the heat plate 320 closer to the heat generating component. In other examples, a heat generating component that is relatively taller can correspond to a gasket that is relatively smaller or shorter in height to accommodate the relatively taller heat generating component. Since different types of heat generating components can have different heights, the gasket can be utilized to alter a height of the heat plate 320 to accommodate a plurality of different heat generating components.

In some examples, the heat plate 320 can be coupled to the heat plate bay or cold plate 303 utilizing a plurality of apertures 308-1, 308-2, 308-3, 308-N. In some examples, the plurality of apertures 308-1, 308-2, 308-3, 308-N can be holes or apertures designated to receive a locking mechanism. For example, the plurality of apertures 308-1, 308-2, 308-3, 308-N can be screw holes designated to receive a screw or bolt. In this example, the plurality of apertures 308-1, 308-2, 308-3, 308-N can include threads that can be utilized to receive a screw or bolt.

In some examples, plurality of apertures 308-1, 308-2, 308-3, 308-N can correspond to a plurality of apertures of a heat plate. In some examples, the plurality of apertures 308-1, 308-2, 308-3, 308-N can be aligned to receive a locking mechanism, such as a screw or bolt, through the plurality of apertures of the heat plate 320. For example, a screw or bolt can be positioned through the plurality of apertures of the heat plate 320 and into the plurality of apertures 308-1, 308-2, 308-3, 308-N of the cold plate 303 to couple the heat plate 320 into the heat plate bay.

In some examples, the heat plate bay can be separated into a plurality of portions 302-1, 302-2, 302-N as descried herein. In some examples, the plurality of portions 302-1, 302-2, 302-N can each correspond to a particular aperture of the first side of the coolant channel 304-1 and correspond to a particular aperture of the second side of the coolant channel 304-2. In some examples, each of the plurality of portions 302-1, 302-2, 302-N can correspond to a first flow direction or a second flow direction.

For example, portion 302-1 can correspond to a first flow direction that can move liquid from an aperture of the first side of the coolant channel 304-1 to the second side of the coolant channel 304-2. In this example, the portion 302-2 can correspond to a second flow direction that can move liquid from an aperture of the second side of the coolant channel 304-2 to the first side of the coolant channel 304-1. In this example, the first side of the coolant channel 304-1 can be split into a plurality of portions that can either be coupled to an input manifold or an output manifold as described herein. In a similar way, the second side of the coolant channel 304-2 can be split into a plurality of portions that can either be coupled to the input manifold or an output manifold. For example, the first side of the coolant channel 304-1 can include a first coolant return and a first coolant supply.

Similarly, second side of the coolant channel 304-2 can include a second coolant return and a second coolant supply. As described herein, a coolant return can be a channel that is coupled to a coolant return manifold to provide the liquid or coolant to a heat exchanger. In addition, a coolant supply can be a channel that is coupled to a coolant supply manifold to provide the liquid or coolant into the heat plate bay from a heat exchanger. Thus, the second side of the coolant channel 304-2 can include a second coolant return that corresponds to the first coolant supply of the first side of the coolant channel 304-1 and a second coolant supply that corresponds to the first coolant return of the first side of the coolant channel 304-1.

In some examples, the system 330 can be cooling device or cooling system for a computing device. For example, the system 330 can be a cooling device or cooling system for a server. In some examples, the system 330 can be utilized with a plurality of different computing devices with a plurality of different computing components. For example, the system 330 can be utilized with processors that have different heights by altering the gasket to adjust the height of the heat plate 320 coupled within the heat plate bay. In this way, the same cold plate 303 and heat plate 320 can be utilized for a plurality of different computing devices without having to alter the structure of the cold plate 303 or heat plate 320.

Figure 4:
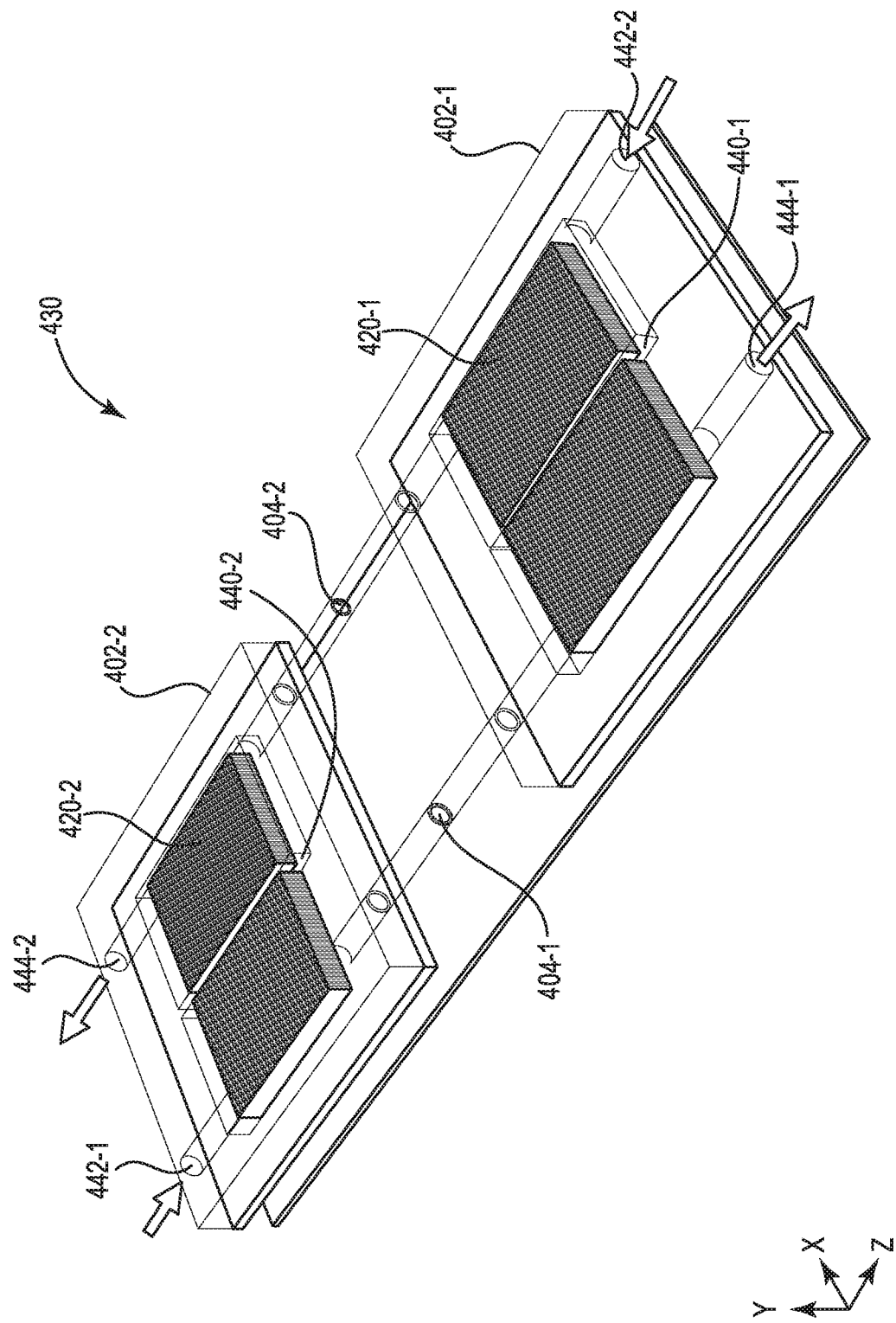
FIG. 4 illustrates an example system for a conductive plastic cold plate with heat plate consistent with the present disclosure.

FIG. 4 illustrates an example system 430 for a conductive plastic cold plate 402-1, 402-2 with heat plate 420-1, 420-2 consistent with the present disclosure. In some examples, the system 430 can illustrate when a heat plate 420-1, 420-2 is coupled to a heat plate bay 402-1, 402-2 of the cold plate. FIG. 4 illustrates the heat plate bay 402-1, 402-2 as transparent to illustrate the interior portion of the heat plate bay 402-1, 402-2 when a heat plate 420-1, 420-2 is coupled to the cold plate. As described herein, the heat plate 420-1, 420-2 can be coupled to the cold plate to seal the heat plate bay 402-1, 402-2 to complete a coolant channel 404-1, 404-2 between the first side of the coolant channel and the second side of the coolant channel.

In some examples, the system 430 can include a heat plate bay 402-1, 402-2 to receive a heat plate 420-1, 420-2. The heat plate 420-1, 420-2 can be positioned at a location that is over an area of a heat generating component of a computing device. As used herein, a heat generating component of a computing device can be a component that can generate heat during operation. For example, the heat generating component can include, but is not limited to: a processor, a memory resource, graphics processor, hard disk drive (HDD), and/or an optical disk drive (ODD).

In some examples, the heat plate bay 402-1, 402-2 can include an aperture to receive the heat plate 420-1, 420-2. For example, the heat plate bay 402-1, 402-2 aperture can include an opening on a first side of the heat plate bay 402-1, 402-2 that can receive a portion of the heat plate 420-1, 420-2. For example, the heat plate 420-1, 420-2 can include a first portion that includes a plurality of fins that can be positioned within the heat plate bay 402-1, 402-2 and a second portion that can be positioned on the exterior sides of the heat plate bay 402-1, 402-2. As used herein, a heat plate 420-1, 420-2 can include a thermally conductive material to transfer heat from a first location to a second location. For example, the heat plate 420-1, 420-2 can remove heat from a heat generating component and transfer the heat into the heat plate bay 402-1, 402-2 of the cold plate.

As described herein, the cold plate can be made of a thermally conductive plastic material. As used herein a thermally conductive plastic material can include a polymer material that is a thermally conductive material with a relatively high thermal conductivity. In some examples, a thermally conductive material can include a material that can transfer heat from a first location to a second location. In some examples, the heat plate that can be positioned within the heat plate bay can be made of a material that has a relatively high thermal conductivity. As used herein, thermal conductivity is a property of a material to conduct heat. Heat transfer occurs at a lower rate in materials that have a relatively low thermal conductivity and heat transfer occurs at a higher rate in materials that have a relatively high thermal conductivity.

In some examples, the heat plate bays 402-1, 402-2 can be coupled to coolant channels 404-1, 404-2. For example, a first side of the heat plate bay 402-1, 402-2 can be coupled to an input side 442-2 of the coolant channel 404-2 and a second side of the heat plate bay 402-1, 402-2 can be coupled to an output side 444-2 of a coolant channel 404-2. In another example, a first side of the heat plate bay 402-1, 402-2 can be coupled to an input side 442-1 of the coolant channel 404-1 and a second side of the heat plate bay 402-1, 402-2 can be coupled to an output side 444-1 of a coolant channel 404-1.

In some examples, the heat plate bay 402-1, 402-2 can be coupled to the first side of the coolant channel 404-1, 404-2 by an aperture within the material of the cold plate that can allow a liquid or coolant to move through the aperture into or out of the heat plate bay 402-1, 402-2. In another example, the heat plate bay 402-1, 402-2 can be coupled to the second side of the coolant channel 404-1, 404-2 by an aperture within the material of the cold plate that can allow a liquid or coolant to move through the aperture into or out of the heat plate bay 402-1, 402-2.

In some examples, the heat plate bay 402-1, 402-2 can include a baffle 440-1, 440-2 that can separate the heat plate bay 402-1, 402-2 into a plurality of portions. In some examples, a first portion can provide a coolant flow path through the heat plate bay 402-1, 402-2 in a first direction and a second portion can provide a coolant flow path through the heat plate bay 402-1, 402-2 in a second direction. For example, a first side of the baffle 440-1, 440-2 can allow coolant to flow from an input side 442-1 through the coolant channel 404-1 to the output side 444-1. In this example, a second side of the baffle 440-1, 440-2 can allow coolant to flow from an input side 442-2 through the coolant channel 404-2 to the output side 444-2.

In some examples, the system 430 can be cooling device or cooling system for a computing device. For example, the system 430 can be a cooling device or cooling system for a server. In some examples, the system 430 can be utilized with a plurality of different computing devices with a plurality of different computing components. For example, the system 430 can be utilized with processors that have different heights by altering the gasket to adjust the height of the heat plate 420-1, 420-2 coupled within the heat plate bay 402-1, 402-2. In this way, the same cold plate and heat plate 420-1, 420-2 can be utilized for a plurality of different computing devices without having to alter the structure of the cold plate or heat plate 420-1, 420-2.

Figure 5:
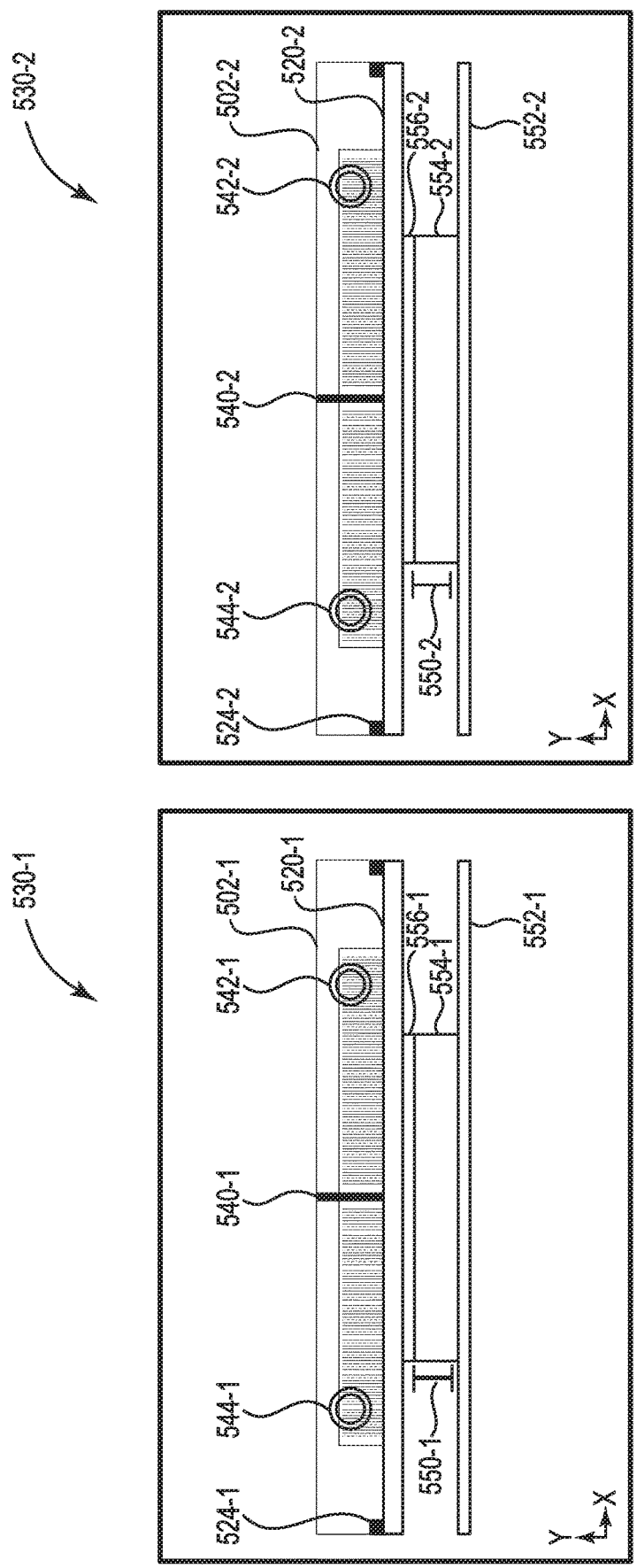
FIG. 5 illustrates an example system for a conductive plastic cold plate with heat plate consistent with the present disclosure.

FIG. 5 illustrates an example system 530-1, 530-2 for a conductive plastic cold plate with heat plate 520-1, 520-2 consistent with the present disclosure. In some examples, the system 530-1 can be utilized for a heat generating component 554-1 with a first height 550-1 and the system 530-2 can be utilized for a heat generating component 554-2 with a second height 550-2. In these examples, the first height 550-1 and the second height 550-2 can be different heights.

In some examples, the system 530-1, 530-2 can include a printed circuit board (PCB) 552-1, 552-2. For example, the PCB 552-1, 552-2 can be a motherboard of a computing device such as a server. In some examples, the heat generating component 554-1, 554-2 can be a processing resource such as a central processing unit (CPU). In some examples, the system 530-1, 530-2 can include a pad 556-1, 556-2 positioned between the heat generating component 554-1, 554-2 and the heat plate 520-1, 520-2. In some examples, the pad 556-1, 556-2 can be a thermal gap pad that can be utilized to transfer heat between the heat generating component 554-1, 554-2 and the heat plate 520-1, 520-2. As used herein, the pad 556-1, 556-2 includes a thermal interface pad that includes a thermally conductive material such as paraffin wax or silicone-based material.

In some examples, the heat plate bay 502-1, 502-2 can include a baffle 540-1, 540-2 that can separate the heat plate bay 502-1, 502-2 into a plurality of portions (e.g., left portion, right portion, as illustrated in FIG. 5, etc.). In some examples, a first portion can provide a coolant flow path through the heat plate bay 502-1, 502-2 in a first direction and a second portion can provide a coolant flow path through the heat plate bay 502-1, 502-2 in a second direction. For example, a first side of the baffle 540-1 can include an input side 542-1 of a coolant channel and a second side of the baffle 540-1 can include an output side 544-1 of a coolant channel. In another example, a first side of the baffle 540-2 can include an input side 542-2 of a coolant channel and a second side of the baffle 540-2 can include an output side 544-2 of a coolant channel.

In some examples, the system 530-1, 530-2 can include a gasket 524-1, 524-2 that is positioned between the heat plate 520-1, 520-2 and the heat plate bay 502-1, 502-2. As used herein, a gasket 524-1, 524-2 can include a material utilized to seal a junction between two surfaces. For example, the gasket 524-1, 524-2 can provide a liquid seal between the heat plate bay 502-1, 502-2 of the cold plate and a heat plate 520-1, 520-2 positioned within the heat plate bay 502-1, 502-2. In some examples, the gasket 524-1, 524-2 can be made of a polymer or rubber material that can compress when the heat plate 520-1, 520-2 is coupled to the heat plate bay 502-1, 502-2 to form a liquid seal between the heat plate 520-1, 520-2 and the heat plate bay 502-1, 502-2. As used herein, a liquid seal can include a seal that can prevent the liquid or coolant from escaping beyond the gasket 524-1, 524-2. For example, the gasket 524-1, 524-2 can provide a liquid seal between the heat plate 520-1, 520-2 and the heat plate bay 502-1, 502-2 such that liquid cannot escape the heat plate bay 502-1, 502-2 when the heat plate 520-1, 520-2 is coupled to the heat plate bay 502-1, 502-2.

In some examples, the gasket 524-1, 524-2 can be a particular height or thickness based on a height 550-1, 550-2 of the heat generating component 554-1, 554-2. In some examples, the height of the gasket 524-1, 524-2 can alter a position of a heat plate 520-1, 520-2 coupled within the heat plate bay 502-1, 502-2. For example, a first gasket 524-1 with a first height can provide the heat plate 520-1 in a first position and a second gasket 524-2 with a second height can provide the heat plate 520-2 in a second position. In some examples, the position or height of the heat plate 520-1, 520-2 can be based on a position or height 550-1, 550-2 of a heat generating component 554-1, 554-2 of the computing device. For example, a first processor can have a first height 550-1 and a second processor can have a second height 550-2 that is different than the first height.

In some examples, a heat generating component 554-1 that is relatively shorter can correspond to a gasket 524-1 that is relatively larger or a gasket 524-1 with a relatively larger height to position the heat plate 520-1 closer to the heat generating component 554-1. In other examples, a heat generating component 554-2 that is relatively taller can correspond to a gasket 524-2 that is relatively smaller or shorter in height to accommodate the relatively taller heat generating component 554-2. Since different types of heat generating components 554-1, 554-2 can have different heights, the gasket 524-1, 524-2 can be utilized to alter a height of the heat plate 520-1, 520-2 to accommodate a plurality of different heat generating components 554-1, 554-2.

In some examples, the system 530-1, 530-2 can be cooling device or cooling system for a computing device. For example, the system 530-1, 530-2 can be a cooling device or cooling system for a server. In some examples, the system 530-1, 530-2 can be utilized with a plurality of different computing devices with a plurality of different computing components. For example, the system 530-1, 530-2 can be utilized with processors that have different heights by altering the gasket to adjust the height of the heat plate 520-1, 520-2 coupled within the heat plate bay 502-1, 502-2. In this way, the same cold plate and heat plate 520-1, 520-2 can be utilized for a plurality of different computing devices or heat generating components 554-1, 554-2 without having to alter the structure of the cold plate or heat plate 520-1, 520-2.

The above specification, examples and data provide a description of the methods and applications and use of the system and method of the present disclosure. Since many examples can be made without departing from the spirit and scope of the system and method of the present disclosure, this specification merely sets forth some of the many possible example configurations and implementations.

What is claimed:

1. An apparatus, comprising:
a cold plate;
a heat plate bay formed in the cold plate, the heat plate bay fluidly coupled to a first side and a second side of a coolant channel;
a heat plate to removably couple to the cold plate and cover an opening into the heat plate bay; and
a gasket coupled to the heat plate to form a seal between the heat plate and the cold plate around the opening to provide a fluid path between the first side and the second side of the coolant channel through the heat plate bay.

2. The apparatus of claim 1, wherein a position of the heat plate relative to a device in which the apparatus is installed depends on a height of the gasket.

3. The apparatus of claim 1,
wherein a portion of the heat plate protrudes through the opening into the heat plate bay when the heat plate is coupled to the cold plate.

4. The apparatus of claim 1, wherein the heat plate includes a plurality of fins extending from a surface of the heat plate that protrude through the opening into the heat plate bay when the heat plate is coupled to the cold plate.

5. The apparatus of claim 1, wherein the first side of the coolant channel includes a first coolant return and a first coolant supply.

6. The apparatus of claim 5, wherein the second side of the coolant channel includes a second coolant return that corresponds to the first coolant supply and a second coolant supply that corresponds to the first coolant return.

7. A computing device, comprising:
a thermally conductive plastic cold plate that comprises a heat plate bay formed therein from the thermally conductive plastic of the cold plate and in fluid communications with a first side and a second side of a coolant channel;
a heat plate formed of a metallic material removably coupled to the cold plate and covering an opening into the heat plate bay; and
a gasket coupled to the heat plate to form a seal between the heat plate and the cold plate around the opening to provide a fluid path between the first side and the second side of the coolant channel through the heat plate bay.

8. The computing device of claim 7, wherein the heat plate bay is positioned over a heat generating component of the computing device.

9. The computing device of claim 8, wherein the gasket alters a height of the heat plate based on a height of the heat generating component.

10. The computing device of claim 7, wherein the first side is a coolant input channel formed within the conductive plastic of the cold plate and wherein the second side is a coolant output channel formed within the conductive plastic of the cold plate.

11. The computing device of claim 10, wherein the coolant input channel is coupled to the heat plate bay and the coolant output channel is coupled to the heat plate bay to form the fluid path between the first side and the second side.

12. The computing device of claim 7, wherein the heat plate bay comprises an aperture to receive a first side of the heat plate; wherein the heat plate comprises a plurality of fins formed on the first side and positioned within the fluid path; and
wherein a second side of the heat plate is exposed when the heat plate is coupled to the heat plate bay.

13. A system, comprising:
a thermally conductive plastic cold plate comprising:
a coolant input coupled to a plurality of coolant input channels;
a coolant output coupled to a plurality of coolant output channels;
a heat plate bay formed in the cold plate from the thermally conductive plastic of the cold plate and in fluid communications with a first coolant input channel and a first coolant output channel on a first side and coupled to a second coolant input channel and a second coolant output channel on a second side;
a heat plate to removably couple to the cold plate and cover an opening into the heat plate bay such that a first side of the heat plate is exposed to the heat plate bay and a second side of the heat plate is exposed to an exterior of the cold plate; and
a gasket coupled to the heat plate to form a seal between the heat plate and the cold plate around the opening to provide a first fluid path between the first coolant input channel and the second coolant output channel through the heat plate bay and a second fluid path between the second coolant input channel and the first coolant output channel through the heat plate bay.

14. The system of claim 13, further comprising a number of apertures positioned within the heat plate to receive a number of corresponding retention mechanisms to couple the heat plate within the heat plate bay.

15. The system of claim 13, wherein the heat plate bay is a first heat plate bay and further comprising a second heat plate bay positioned on the cold plate and in fluid communications with the first heat plate bay by the second coolant input channel and the second coolant output channel.

16. The system of claim 13, wherein the thermally conductive plastic cold plate is positioned over a motherboard of a computing device.

17. The system of claim 13, wherein the heat plate bay is divided into a plurality of portions.

18. The system of claim 13, further comprising a coolant channel input manifold coupled to the plurality of coolant input channels and a coolant channel output manifold coupled to the plurality of coolant output channels.

* * * * *